United States Patent
Fujimoto et al.

(10) Patent No.: US 9,281,420 B2
(45) Date of Patent: Mar. 8, 2016

(54) CHEMICAL VAPOR DEPOSITED FILM FORMED BY PLASMA CVD METHOD

(71) Applicant: TORAY ENGINEERING CO., LTD., Chuo-ku, Tokyo (JP)

(72) Inventors: Takayoshi Fujimoto, Otsu (JP); Masamichi Yamashita, Otsu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 0 days.

(21) Appl. No.: 14/382,823

(22) PCT Filed: Jan. 16, 2013

(86) PCT No.: PCT/JP2013/050606
§ 371 (c)(1),
(2) Date: Sep. 4, 2014

(87) PCT Pub. No.: WO2013/132889
PCT Pub. Date: Sep. 12, 2013

(65) Prior Publication Data
US 2015/0068600 A1    Mar. 12, 2015

(30) Foreign Application Priority Data
Mar. 7, 2012 (JP) .................. 2012-050960

(51) Int. Cl.
*H01L 31/0203* (2014.01)
*C23C 16/40* (2006.01)
*C23C 16/505* (2006.01)
*H01L 21/56* (2006.01)
*H01L 23/29* (2006.01)
*H01L 51/52* (2006.01)

(52) U.S. Cl.
CPC .......... *H01L 31/0203* (2013.01); *C23C 16/401* (2013.01); *C23C 16/505* (2013.01); *H01L 21/56* (2013.01); *H01L 23/291* (2013.01); *H01L 51/5253* (2013.01); *H01L 2924/0002* (2013.01)

(58) Field of Classification Search
CPC ............... H01L 31/1804; H01L 31/03926; H01L 31/048; H01L 31/0481
See application file for complete search history.

(56) References Cited

U.S. PATENT DOCUMENTS 8,609,982 B2 * 12/2013 Chang .................... B82Y 20/00
136/252
2004/0227165 A1 * 11/2004 Wang .................... H01L 29/768
257/222

(Continued)

FOREIGN PATENT DOCUMENTS

JP    05-345383 A    12/1993
JP    2005-097678 A    4/2005

(Continued)

OTHER PUBLICATIONS

International Search Report of the corresponding International Application No. PCT/JP2013/050606, dated Feb. 12, 2013.
Eiji Iiwamura, Improvement of Adhesion Strength in Thin Films, "Surface Technology" journal, 2007, pp. 260-266, vol. 58, No. 5, The Surface Finishing Society of Japan, Japan.

*Primary Examiner* — Golam Mowla
(74) *Attorney, Agent, or Firm* — Global IP Counselors, LLP

(57) ABSTRACT

A chemical vapor deposited film includes silicon atoms, oxygen atoms, carbon atoms, and hydrogen atoms. The chemical vapor deposited film is formed by a plasma CVD method such that the concentration of the oxygen atoms is 10-35% by element.

14 Claims, 6 Drawing Sheets

(56) References Cited

U.S. PATENT DOCUMENTS

| | | | |
|---|---|---|---|
| 2005/0255619 A1* | 11/2005 | Negro | B82Y 10/00 438/28 |
| 2006/0078676 A1 | 4/2006 | Lukas et al. | |
| 2010/0193461 A1 | 8/2010 | Boutroy et al. | |

FOREIGN PATENT DOCUMENTS

| | | |
|---|---|---|
| JP | 2007-221039 A | 8/2007 |
| JP | 2007-262551 A | 10/2007 |
| JP | 2010-114452 A | 5/2010 |
| JP | 2010-532708 A | 10/2010 |

* cited by examiner

CHEMICAL VAPOR DEPOSITED FILM FORMED BY PLASMA CVD METHOD

CROSS-REFERENCE TO RELATED APPLICATIONS

This application is a U.S. National stage of International Application No. PCT/JP2013/050606 filed on Jan. 16, 2013. This application claims priority to Japanese Patent Application No. 2012-050960 filed with Japan Patent Office on Mar. 7, 2012. The entire disclosure of Japanese Patent Application No. 2012-050960 is hereby incorporated herein by reference.

BACKGROUND

1. Field of the Invention

The present invention relates to a chemical vapor deposited film formed by the plasma CVD method and a layered body, thin-film solar cells that comprise the same, and a manufacturing method for the layered body.

2. Background Information

In recent years, regarding display devices using organic EL, liquid crystal, etc., the methods for weight reduction and making thin film, as well as, from the point of view of making them flexible, methods to use plastic sheets or plastic film as the base material have been developed and proposed. From the point of view of maintaining the visibility of the display unit and preventing oxidation and deterioration of the element part that is formed on the surface of the base material, a gas barrier film having gas barrier properties with extremely high oxygen and vapor barrier properties is in demand. Additionally, regarding solar cells, from the point of view of preventing the degradation of the power generation layer and the electrodes, etc., and prolonging the lifetime, a gas barrier film that has both high gas barrier properties and flexibility is in demand.

A method to form a gas barrier film with high gas barrier properties by the plasma CVD method using a layered structure of an organic layer and an inorganic layer, or two inorganic layers, has become common.

Patent Document 1 (Japanese Laid-Open Patent Application Publication No. H5-345383) proposes forming a polymer-coated layer consisting of silicon (Si), carbon (C), and oxygen (O) as the first layer and a silicon oxide compound layer represented by $SiO_X$ (X=1.5-2.0) as the second layer as a method to form a barrier film with strong adhesion and high barrier properties on a plastic base material surface using the plasma CVD method. Patent Document 2 (Japanese Laid-Open Patent Application Publication No. 2005-097678) also proposes forming an adhesion reinforcing layer consisting of silicon (Si), carbon (C), and oxygen (O) as the first layer and a barrier film consisting of silicon oxide as the second layer as a method to form a barrier film with strong adhesion and high barrier properties on a base material surface such as plastic vessels, using the plasma CVD method.

However, while the above-described barrier film will exhibit good adhesion to a base material of a single plastic, adhesion to a base material in which plastic (an organic substance) and metal (an inorganic substance) are mixed onto a surface that forms a barrier film, such as organic EL elements and solar cells, etc., which are weak against moisture and oxygen, is insufficient; additionally, a film consisting of only silicon (Si), carbon (C), and oxygen (O) is, in general, highly dense and lacks flexibility, so there was a problem that breaking the barrier film was likely to occur.

Patent Document 3 (Japanese Laid-Open Patent Application Publication No. 2007-262551) discloses that a silicon-based thin film having strong adhesion and high barrier properties can be formed by forming a first thin film by the plasma CVD method on a plastic film or an electronic device, such as organic EL, etc., using a gas comprising hydrogen atoms and a gas comprising silicon atoms, and forming a second thin film with a barrier function on the first thin film. Specifically, a film is formed using hexamethyldisilazane (hereinafter sometimes referred to as HMDS), which is an organic silicon-based compound that does not comprise oxygen atoms, and a mixed gas of $H_2$ and Ar. However, with this film, adhesion with an especially transparent conductive film and metal film that exist in organic EL elements and solar cells, etc., was insufficient, so there was the problem that breaking the barrier film was likely to occur.

Also, as a well-known method, there is a method to improve the adhesion between the barrier film and the base material by irradiating plasma to the base material before forming the barrier film in order to activate and modify the surface, as disclosed in Non-Patent Literature 1 (Surface Technology Vol. 58 (2007), No. 5, p. 260-p. 266), p. 262, lines 18-25. However, this generates significant deterioration (oxidation degradation, etc.) of the base material with organic EL elements and solar cells, etc.; therefore, this method could not be used.

SUMMARY

The present invention was made in light of these problems with conventional technology; the aim is to provide a film structure of and a manufacturing method for a gas barrier film that has excellent adhesion to both organic substances and inorganic substances, that strongly adheres to both organic and inorganic substances, and that has high barrier properties in a base material consisting of organic substances, a base material consisting of inorganic substances, and a base material in which organic substances and inorganic substances are mixed.

As a result of dedicated research to achieve the above-described aim, the present inventors found that a gas barrier film with strong adhesion and high barrier properties can be formed; additionally, they found that a barrier film with good adhesion with respect to a base material, in which especially organic substances (an organic-based power generation layer, a light emitting layer, a plastic film (PET and PEN), etc.) and inorganic substances (a transparent conductive film, metal electrodes, an inorganic-based power generation layer, etc.) are mixed on the surface, such as organic EL elements and solar cells, etc., which are easily deteriorated by moisture and oxygen, can be formed without damaging the base material by structuring the first three layers with a first thin layer (an adhesive layer), a second thin film (a flexible layer), and a third thin film (a barrier layer) in that order from the base material side; this method also involves properly using the raw material when forming each layer according to the presence/absence of oxygen atoms included in the organic silicon compound molecules and making the compound a prescribed combination to complete the present invention.

In other words, the present invention provides a chemical vapor deposited film comprising silicon atoms, oxygen atoms, carbon atoms, and hydrogen atoms, wherein the concentration of the oxygen atoms is 10-35% by element and the film is formed by the plasma CVD method.

The present invention also provides a layered body comprising the above-described chemical vapor deposited film; a second chemical vapor deposited film comprising silicon atoms and greater than or equal to 0% by element and less than 10% by element of oxygen atoms and is formed by the plasma CVD method; and a third chemical vapor deposited film comprising silicon atoms and more than 35% by element and less than or equal to 70% by element of oxygen atoms and is formed by the plasma CVD method, wherein the second chemical vapor deposited film and the third chemical vapor deposited film are layered on one of the surfaces of the chemical vapor deposited film.

The layered body of the present invention is preferably formed by a plurality of alternately layered layers of the second chemical vapor deposited film and the third chemical vapor deposited film.

Also, the above-described second chemical vapor deposited film preferably comprises carbon atoms.

Preferably, the film also comprises a base material including an inorganic substance, and the chemical vapor deposited film is layered on the base material so that the surface of the chemical vapor deposited film on which the second chemical vapor deposited film and the third chemical vapor deposited film are not layered is in contact with the above-described inorganic substance.

Additionally, the inorganic substance preferably comprises Ag, Al, and Mo or a transparent electrode film selected from the group consisting of ZnO, ITO, BZO, AZO, and GZO.

The present invention also provides an organic electroluminescent element or a thin film solar cell comprising the above-described layered body.

Furthermore, the present invention provides a manufacturing method for the above-described layered body comprising a first step in which the chemical vapor deposited film is formed on the base material by the plasma CVD method using a raw material gas consisting of an organic silicon compound comprising oxygen atoms; a second step in which the second chemical vapor deposited film is formed on the chemical vapor deposited film by the plasma CVD method using a raw material gas consisting of an organic silicon compound and a compound comprising $H_2$ or hydrogen atoms; and a third step in which the third chemical vapor deposited film is formed on the chemical vapor deposited film by the plasma CVD method using a raw material gas consisting of an organic silicon compound and a compound comprising $O_2$ or oxygen atoms.

In the manufacturing method for the layered body of the present invention, the organic silicon compound preferably comprises the oxygen atoms as hexamethyldisiloxane.

The present invention provides a film structure of and a manufacturing method for a gas barrier film that has excellent adhesion to both organic substances and inorganic substances, that strongly adheres to both organic and inorganic substances, and that has high barrier properties in a base material consisting of organic substances, a base material consisting of inorganic substances, and a base material in which organic substances and inorganic substances are mixed. In particular, a barrier film with good adhesion with respect to a base material, in which especially organic substances (an organic-based power generation layer, a light emitting layer, a plastic film (PET and PEN), etc.) and inorganic substances (a transparent conductive film, metal electrodes, an inorganic-based power generation layer, etc.) are mixed and exposed on the surface, such as organic EL elements and solar cells, etc., which are easily deteriorated by moisture and oxygen, can be formed without damaging the base material.

Figure 1:
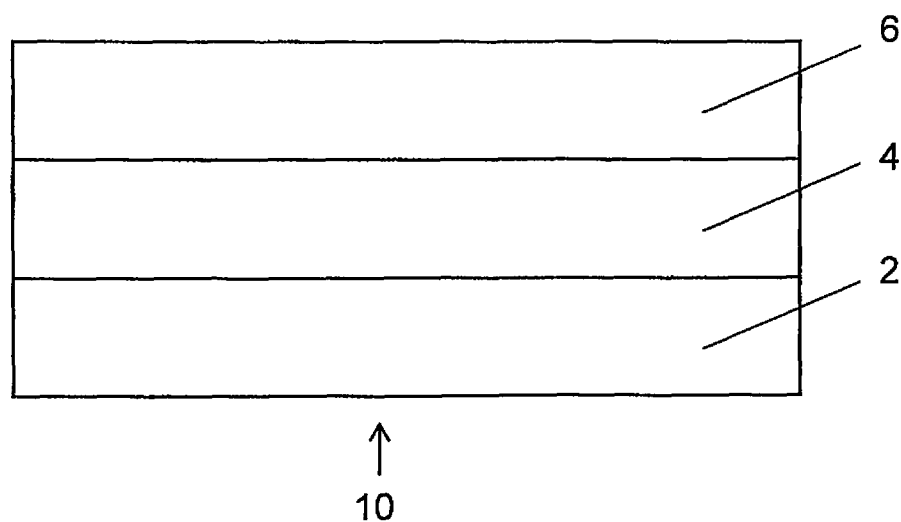
FIG. 1 is a diagram schematically showing a layered body 10 according to one embodiment of the present invention.

DETAILED DESCRIPTION OF EMBODIMENTS (1) Chemical Vapor Deposited Film (Adhesion Layer)

The chemical vapor deposited film of the present invention is formed by the plasma CVD method, comprising silicon atoms, oxygen atoms, carbon atoms, and hydrogen atoms, and the concentration of oxygen atoms is 10-35% by element. By comprising hydrogen atoms and making the range of the oxygen atoms within the above-described range, when the film is formed on a base material, excellent adhesion can be obtained with respect to both inorganic and organic substances on the base material. The concentration of the above-described oxygen atoms is preferably 10-25% by element, is more preferably 10-20% by element, and is even more preferably 10-15% by element. Examples of the above-described organic substance in the base material include a polymer film, such as a PET film. Additionally, examples of the inorganic substances include Ag, Al, and Mo or a transparent electrode film, such as ZnO, ITO, BZO, AZO, GZO, etc.

Regarding adhesion with inorganic substances, for example, in the case of Ag, an assumption can be made that binding and adhesion will occur via oxygen atoms, such as Ag—O—Si and Ag—O—O—Si. The reason adhesion becomes poor when the concentration of the oxygen atom (O) in the chemical vapor deposited film is less than 10% by element may be because, if there is little O in the film, the binding amount also is reduced, which causes the adhesion to become poor. Additionally, the effects of inorganic substances, such as Ag, having catalytic activity can be considered; therefore, the thought is that the concentration of oxygen atoms should necessarily be greater than or equal to 10% by element. Meanwhile, in the case that the concentration of oxygen atoms is greater than 35% by element, there is too much oxygen in the film, causing the oxidation of the surface to excessively progress and damage the film, which results in performance deterioration, such as an increase in resistivity. Also, the appearance will blacken.

Regarding adhesion with organic substances, for example, in the case of PET, an assumption can be made that binding and adhesion will occur via the OH groups or the COOH groups that exist on the surface. While the OH groups and the COOH groups also exist on the surface of inorganic substances, such as Ag, in the case of organic substances, adhesion can become good at an amount that is less when compared to inorganic substances, such as Ag. This difference is thought to be due to the fact that inorganic substances, such as PET, do not have catalytic activity. Meanwhile, when the concentration of oxygen atoms exceeds 35% by element, since the composition of the film will approach $SiO_2$, the film density will increase and will become a film lacking flexibility, thereby making the adhesion poor. The thought is that, in this kind of film, compatibility with organic substances such as PET, which has large expansion, shrinkage, and flexibility, becomes poor.

The composition of the chemical vapor deposited film of the present invention can be set to, for example, 10-35% by element of oxygen atoms, 10-30% by element of silicon atoms, 10-30% by element of carbon atoms, and 10-50% by element of hydrogen atoms. The composition does not need to comprise nitrogen atoms. In the case of this kind of composition, the adhesion to specifically both inorganic and organic base materials is excellent, making this composition preferable.

The film thickness of the chemical vapor deposited film is, for example, 5-400 nm and is, preferably, 5-200 nm. Additionally, the density of the above-described chemical vapor deposited film is, preferably, 1.7-1.9 g/cm$^3$, for example.

(1-1) Method of Measuring the Oxygen Atom Concentration

In the present invention, the concentration of oxygen atoms in the chemical vapor deposited film can be determined by Rutherford backscattering spectroscopy (RBS) and compositional analysis using hydrogen forward scattering analysis (HFS). The concentration of silicon atoms and carbon atoms can be measured in the same way. Regarding the hydrogen atoms, since they cannot be analyzed using RBS, they are measured using HFS.

In RBS, fast ions (He$^+$, H$^+$, etc.) are irradiated on the sample, and the energy and yield of the scattered ions are measured regarding a part of the incident ions that have undergone elastic (Rutherford) scattering by the nuclei in the sample. The energy of the scattered ions is different, depending on the mass and the location (the depth) of the target atoms; therefore, the elemental composition of the sample in the depth direction can be obtained from the energy and the yield of these scattered ions. In HFS, by utilizing the fact that hydrogen in the sample will be scattered forward due to elastic recoil by irradiating fast ions (He$^+$) on the sample, the depth distribution of hydrogen is obtained from the energy and the yield of this recoiled hydrogen.

The chemical vapor deposited film of the present invention is formed by controlling the concentration of the oxygen atoms to be between 10-35% by element by adjusting the supplied gas and the plasma power (the applied power) in the plasma CVD method.

Organic silicon compounds comprising oxygen atoms are used as the raw material gas. Specific examples include HMDSO by itself, HMDSO+Ar/H$_2$, HMDSO+O$_2$, HMDSO+HMDS, HMDS+O$_2$, etc. Of the above, HMDSO by itself is preferable.

(2) Layered Body

The layered body of the present invention comprises the above-described chemical vapor deposited film (hereinafter, this may be referred to as the adhesive layer); the second chemical vapor deposited film (hereinafter, this may be referred to as the flexible layer); and the third chemical vapor deposited film (hereinafter, this may be referred to as the barrier layer). The second chemical vapor deposited film and the third chemical vapor deposited film are each formed on one of the surfaces of the chemical vapor deposited film by the plasma CVD method. The flexible layer can be formed on the adhesive layer, and the barrier layer can be formed on the flexible layer; alternatively, the barrier layer can be formed on the adhesive layer, and the flexible layer can be formed on the barrier layer.

FIG. 1 schematically shows a layered body 10 according to one embodiment of the present invention, with 2 being the adhesive layer, 4 being the flexible layer, and 6 being the barrier layer. With this kind of configuration, a layered body 10 that has excellent adhesion with a base material (not shown) comprising organic substances and inorganic substances and that can effectively be a barrier against steam can be obtained.

Each layer comprises silicon atoms. The amount of oxygen atoms is 10-35% by element in the adhesion layer 2, as described above; greater than or equal to 0% by element and less than 10% by element in the flexible layer 4; and greater than 35% by element and less than or equal to 70% by element in the barrier layer 6. The amount of oxygen atoms can be measured in the way described above.

The second chemical vapor deposited film (a flexible layer 4) may comprise carbon atoms in addition to silicon atoms and oxygen atoms. In the present invention, the composition of the second chemical vapor deposited film may be less than 10% by element of oxygen atoms, 10-20% by element of silicon atoms, and 20-35% by element of carbon atoms. The composition can also comprise, for example, 30-55% by element of hydrogen atoms. The composition can comprise, for example, less than or equal to 10% by element (around 0-10% by element) of hydrogen atoms.

The film thickness of the second chemical vapor deposited film is, for example, 5-1000 nm and, preferably, 5-500 nm. Additionally, the density of the second chemical vapor deposited film is preferably less than 1.7 g/cm$^3$ (for example, greater than or equal to 1.2 g/cm$^3$ and less than 1.7 g/cm$^3$).

The third chemical vapor deposited film (a barrier layer 6) may be configured so that there is 60-70% by element of oxygen atoms and 30-35% by element of silicon atoms. This layer can also comprise carbon atoms. Additionally, this layer can comprise less than or equal to 5% by element (around 0-5% by element) hydrogen atoms. This layer does not need to comprise nitrogen atoms.

The film thickness of the third chemical vapor deposited film is, for example, 5-1000 nm and is, preferably, 5-500 nm. Additionally, the density of the third chemical vapor deposited film is preferably greater than 1.9 g/cm$^3$ (for example, greater than 1.9 g/cm$^3$ and less than 2.2 g/cm$^3$).

Examples of the composition of each layer of the layered body 10 of the present invention are shown in Table 1.

TABLE 1

| | Constituent elements (unit: % by element) | | | | |
|---|---|---|---|---|---|
| | Si | H | C | N | O |
| Barrier layer 6 | 30-35 | less than or equal to 5 | 0 | 0 | 60-70 |
| Flexible layer 4 | 10-20 | 30-55 | 20-35 | less than or equal to 10 | less than or equal to 10 |
| Adhesion layer 2 | 10-30 | 10-50 | 10-30 | 0 | 10-35 |

Figure 2:
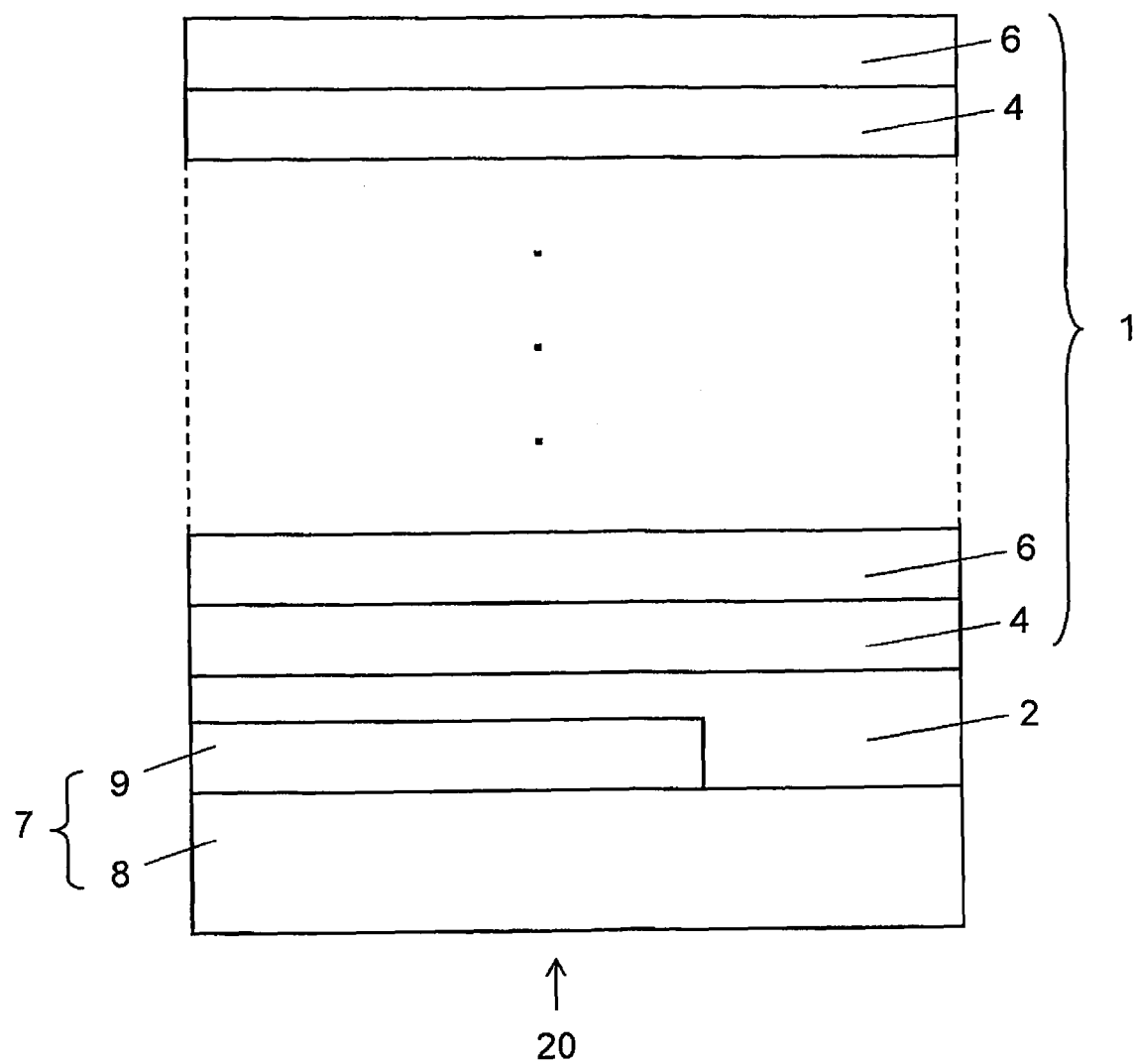
FIG. 2 is a diagram schematically showing a layered body 20 according to one embodiment of the present invention.

The layered body of the present invention may be formed by a plurality of alternately layered layers of the second chemical vapor deposited film and the third chemical vapor deposited film. FIG. 2 schematically shows a layered body 20 according to another embodiment of the present invention, with 8 being an organic base material such as plastic film, etc., and 9 being an inorganic base material such as Ag, etc. The adhesion layer 2, the flexible layer 4, and the barrier layer 6 are layered on the base material 7 composed of these in this order. Additionally, a plurality of flexible layers 4 and barrier layers 6 are alternately layered at n layers each to form a sealing film 1. By providing this kind of sealing layer 1 on the adhesion layer 2, making a film with excellent adhesion and water vapor barrier properties is possible. In FIG. 2, the order in which the flexible layer 4 and barrier layer 6 are formed on the adhesion layer 2 can be reversed. N may be an integer between 1-10, and the number of layers of the flexible layer 4/barrier layer 6 is preferably 6/6, 7/7, 8/8, etc.

(3) The Organic Electroluminescent Element

The organic electroluminescent element or the thin film solar cell of the present invention comprises the above-described layered body 20. For this reason, excellent adhesion and barrier properties can be realized. Specifically, there is excellent adhesion with a transparent conducting film and metal film that exist in organic EL elements and solar cells, etc.

Figure 3:
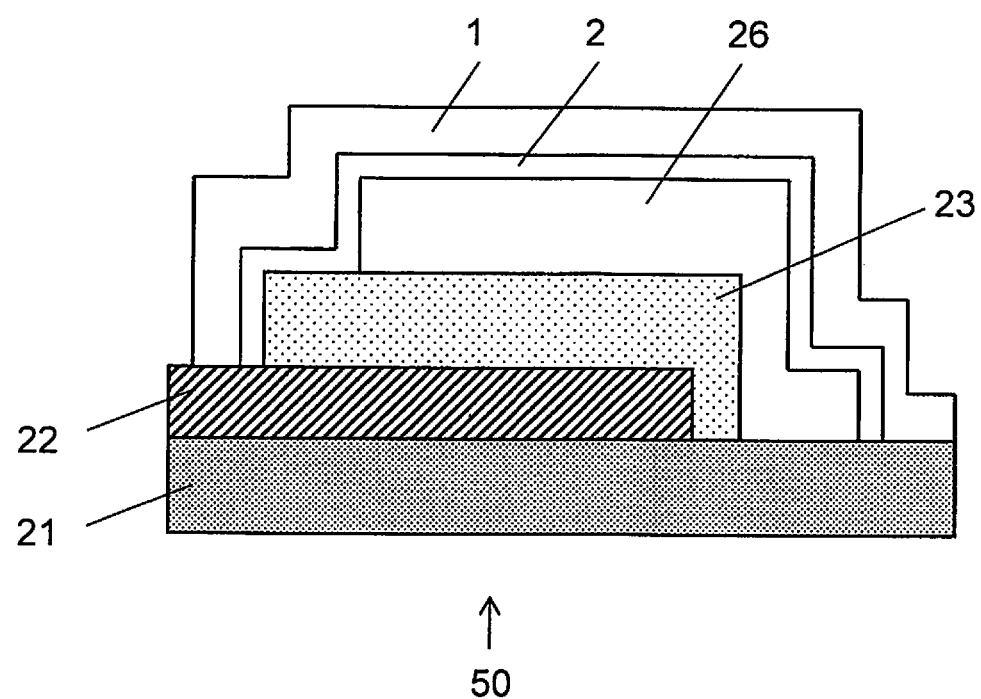
FIG. 3 is a diagram schematically showing a cross section of a thin film solar cell 50 according to one embodiment of the present invention.

FIG. 3 schematically shows a cross section of the thin film solar cell 50 according to one embodiment of the present invention, with 21 being a plastic substrate, 22 being an ITO electrode, 23 being a power generation layer (an organic-based power generation layer or an inorganic-based power generation layer), and 26 being an Ag electrode. The sealing layer 1 is layered on a base material (the plastic substrate 21, the ITO electrode 22, the power generation layer 23, and the Ag electrode 26) comprising these organic substances and inorganic substances via the adhesion layer 2.

(4) Manufacturing Method for the Layered Body

The manufacturing method for the layered body of the present invention comprises a first step in which the chemical vapor deposited film is formed on the base material by the plasma CVD method using a raw material gas consisting of an organic silicon compound comprising oxygen atoms; a second step in which the second chemical vapor deposited film is formed on the chemical vapor deposited film formed in the first step by the plasma CVD method using a raw material gas consisting of an organic silicon compound and a compound comprising hydrogen atoms; and a third step in which the third chemical vapor deposited film is formed on the chemical vapor deposited film formed in the first step by the plasma CVD method using a raw material gas consisting of an organic silicon compound and a compound comprising oxygen atoms. By alternately conducting the second and third steps a plurality of times, a layered body in which a plurality of layers of the second chemical vapor deposited film and the third chemical vapor deposited film are alternately layered can be obtained.

In the above-described second and third steps, using an organic silicon compound that does not comprise oxygen atoms is preferable. Additionally, having the organic silicon compound comprising oxygen atoms be hexamethyldisilazane and having the organic silicon compound that does not comprise oxygen atoms be hexamethyldisiloxane is preferable.

Figure 4:
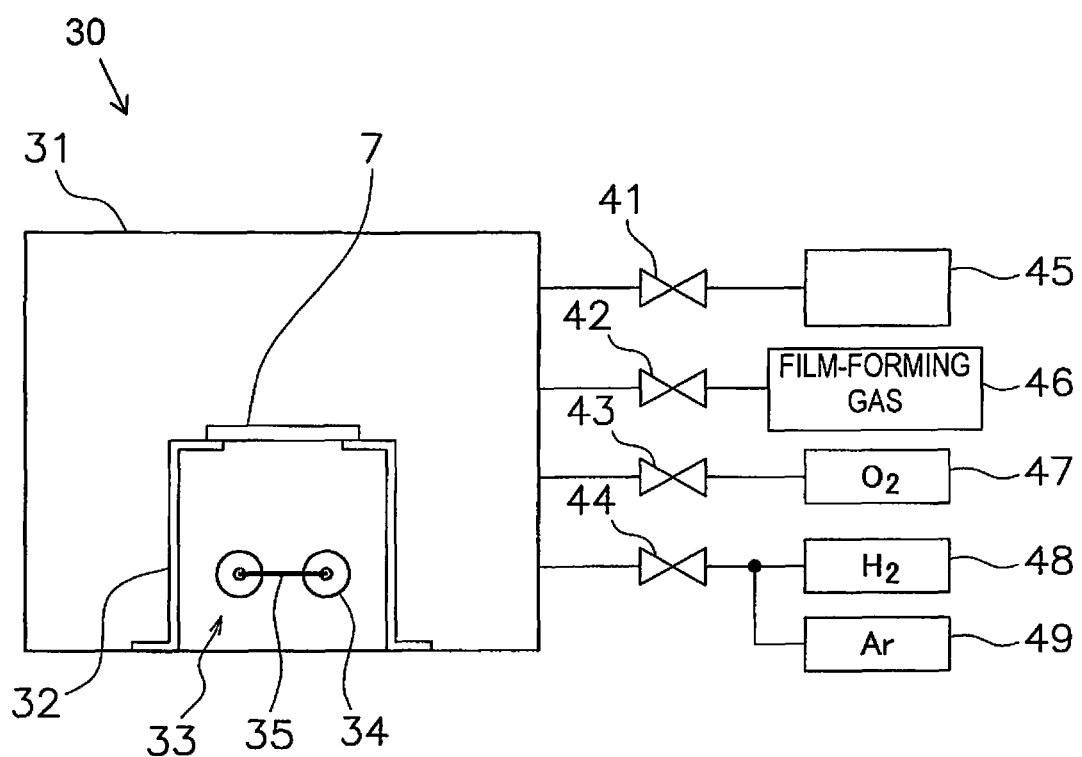
FIG. 4 is a schematic diagram of a lateral cross section of a film forming device 30.
Figure 5:
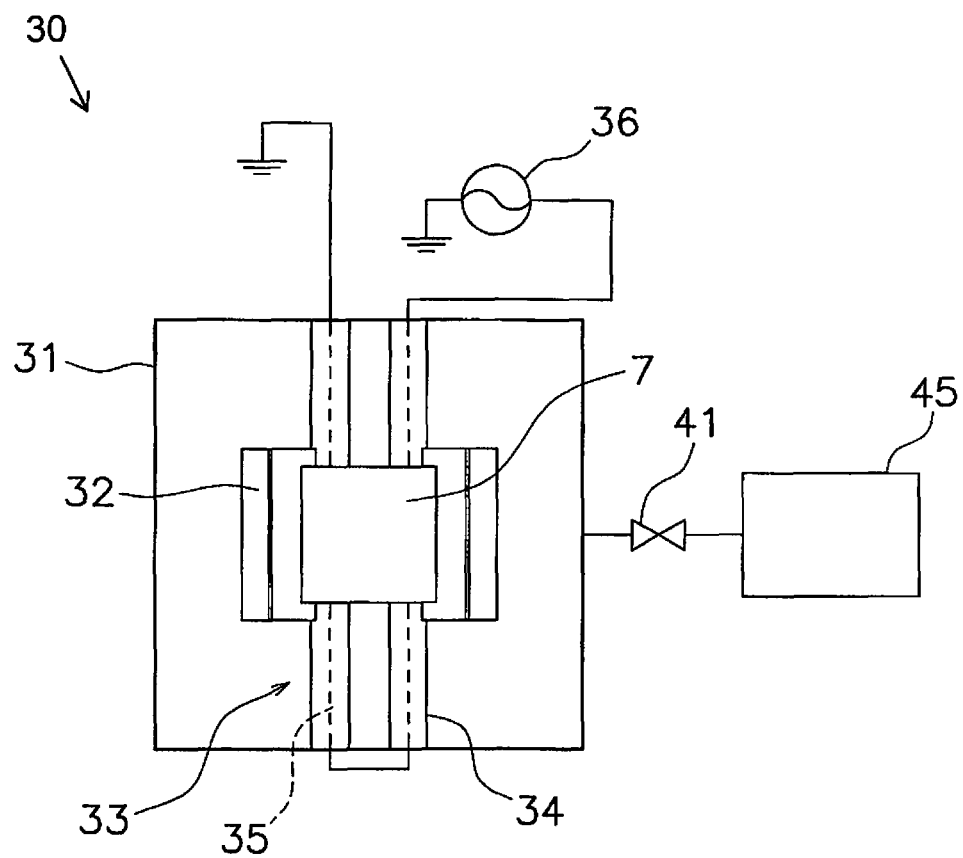
FIG. 5 is a schematic diagram of the film forming device 30, as seen from above.

FIG. 4 (a lateral cross-sectional view) and FIG. 5 (a top view) show a block diagram of a film forming device. A vacuum chamber, which is a film deposition chamber 31, an exhaust system 45 comprising a rotary pump and a turbo-molecular pump, a high-frequency power source 36 for generating plasma, and a flange for introducing various gases are disposed in the film forming device 30.

The film deposition chamber 31 is connected to the exhaust system 45, a film-forming gas tank 46, an $O_2$ supply tank 47, an $H_2$ supply tank 48, and an Ar supply tank 49. The exhaust system 45 is connected to the film deposition chamber 31 via a flow rate control valve 41. The film-forming gas tank 46 is connected to the film deposition chamber 31 via a flow rate control valve 42, the $O_2$ supply tank 47 via a flow rate control valve 43, and the $H_2$ supply tank 48 and the Ar supply tank 49 via a flow rate control valve 44. A loop antenna 33 is provided inside of the film deposition chamber 31.

The loop antenna 33 is a means for generating plasma and is configured by an insulating tube 34 and a conductive electrode 35. Two insulating tubes 34 are disposed in parallel, opposing each other in the film deposition chamber 31. The conductive electrode 35 is inserted into the two insulating tubes 34 and extends through the opposing side walls of the film deposition chamber 31 so as to take on a nearly U-shape in the plan view, as shown in FIG. 5; the electrode is also connected to the high-frequency power source 36 that supplies a high-frequency current. The frequency of the high-frequency current is preferably 13.56 MHz. Meanwhile, the plasma to be used may be CCP, ICP, a barrier discharge, a hollow discharge, etc.

After disposing a base material 7 on which the film is formed onto a fixed base 32 of the base material so that the deposition surface faces the loop antenna 33 side, the internal pressure of the film deposition chamber 31 is depressurized with the exhaust system 45 in order to be, preferably, less than or equal to $9.9 \times 10^{-5}$ Pa.

After decompression inside of the film deposition chamber 31 has been completed, the raw material gas is introduced into the film deposition chamber 31 by opening the flow rate control valves 42-44. The raw material gas can be appropriately selected so that the chemical vapor deposited film comprises silicon atoms, oxygen atoms, carbon atoms, and hydrogen atoms and so that the concentration of the oxygen atoms will be 10-35% by element. Specific examples of the raw material gas include HMDSO gas by itself, HMDSO+Ar/$H_2$, HMDSO+$O_2$, HMDSO+HMDS, HMDS+$O_2$, etc. Of the above, HMDSO by itself is preferable. The rate of introduction of the gas may be 3 sccm-45 sccm.

Next, a high-frequency current flows from the high-frequency power source 36 to the loop antenna 33, and plasma is generated in the periphery of the loop antenna 33. The plasma power at this time may be 1 kW-10 kW. A surface reaction takes place on the surface of the base material 7, and a chemical vapor deposited film is formed on the base material 7. After a prescribed time has elapsed, the introduction of gas is stopped by closing the flow rate control valves 42-44.

After forming the chemical vapor deposited film (the adhesion layer 2), for example, the second chemical vapor deposited film (the flexible layer 4) is formed in the same way as described above. First, the flow rate control valve 44 is opened, and, for example, a mixed gas of $H_2$ gas and Ar gas is introduced in the film deposition chamber 31. At the same time, raw material gas of HMDS gas, etc., is introduced with the flow rate control valve 42. The rate of introduction of each gas at this time may be 20 sccm-40 sccm for the mixed gas of $H_2$ gas and Ar gas and 3 sccm-20 sccm for the HMDS gas. Next, the high-frequency current flows from the high-frequency power source 36 to the loop antenna 33 so that the plasma power will be 0.1 kW-10 kW and so that plasma is generated in the periphery of the loop antenna 33.

A surface reaction takes place on the surface of the base material 7, and a flexible layer 4 is formed so as to cover the adhesion layer 2, as shown in FIG. 2. After a prescribed time has elapsed, the introduction of gas is stopped by closing the flow rate control valves 42 and 44.

After forming the second chemical vapor deposited film (the flexible layer 4), the third chemical vapor deposited film (the barrier layer 6) is formed in the same way as described above. First, the flow rate control valve 43 is opened, and, for example, $O_2$ gas is introduced into the film deposition chamber 31. At the same time, raw material gas of HMDS gas, etc., is introduced with the flow rate control valve 42. The rate of introduction of each gas at this time may be, for example, 20 sccm-1000 sccm for $O_2$ gas and 3 sccm-20 sccm for the HMDS gas. Next, the high-frequency current flows from the high-frequency power source 36 to the loop antenna 33 so that the plasma power will be 0.1 kW-8 kW and so that plasma is generated in the periphery of the loop antenna 33.

A surface reaction takes place on the surface of the base material 7, and a barrier layer 6 (the silicon oxide film) is formed so as to cover the flexible layer 4, as shown in FIG. 2. After a prescribed time has elapsed, the introduction of gas is stopped by closing the flow rate control valves 42 and 43. This silicon oxide film preferably comprises Si and O at a composition ratio of Si:O=1:1.9-2.1.

The process conducted for the above-described flexible layer 4 and the barrier layer 6 is repeated n times (n is, for example, n=7, in the same way as described above). As a result, as shown in FIG. 2, an adhesion layer 2 is layered on the base material 7, and a seven-step layered body, in which a silicon oxide film (the barrier layer 6) is layered on a flexible layer 4 comprising silicon, is formed.

As described above, first, HMDSO gas, etc., is used as the raw material gas, and an adhesion layer 2 is formed on the base material 7 with the plasma CVD method; next, a flexible layer 4 is formed on the adhesion layer 2 using HMDS gas, HMDSO gas, etc. A barrier layer 6 is also formed on the flexible layer 4 using HMDS gas, HMDSO gas, etc. Meanwhile, here, film formation in the order of the adhesion layer, the flexible layer, and the barrier layer was shown; however, the flexible layer can also be formed on the barrier layer after forming the barrier layer on the adhesion layer. Additionally, a silicon nitride film may be layered as an intermediate layer using $NH_3$ gas and $SiH_4$ gas, etc.

The method of the present invention does not use an etching process, etc., unlike the prior art, so this invention will not damage the base materials, such as a solar cell. Additionally, the layered body of the adhesion layer 2, the flexible layer 4, and the barrier layer 6 has a function to protect the base materials, such as a solar cell, from plasma energy as the vapor-phase growth chemically occurs on the base material 7; therefore, damage to the device by plasma energy can be reduced. Also, since the formation of the adhesion layer 2 and the formation of the flexible layer 4 and the barrier layer 6 take place in the same chamber (in the film deposition chamber 31), the structure of the device can be simplified.

EXAMPLES

The present invention is described in further detail below based on examples, but the present invention is not limited by these examples.

Example 1

An Ag layer with a thickness of 200 nm was formed on a part of the surface of a plastic film. This film was disposed on a base material fixed base in a film deposition chamber so that the surface having the Ag layer faces the loop antenna side. Next, the internal pressure of the film deposition chamber was depressurized until the pressure became less than or equal to $9.9 \times 10^{-5}$ Pa using an exhaust system. After decompression inside of the film deposition chamber was completed, HMDSO gas was introduced into the film deposition chamber. The rate of introduction of the HMDSO gas was 3 sccm-45 sccm.

Next, a high-frequency current flowed from a high-frequency power source to the loop antenna. The plasma power at this time was 1 kW-10 kW. A surface reaction took place on the surface of the base material, and an adhesion layer that has an Ag layer and that covers the plastic film was formed. One minute later, the flow rate control valve was closed in order to stop the introduction of the HMDSO gas.

After forming the adhesion layer, a forming process for a flexible layer was conducted using HMDS gas and a mixed gas of $H_2$ gas and Ar gas. The rate of introduction of HMDS gas at this time was 3 sccm-20 sccm, the rate of introduction of the mixed gas of $H_2$ gas and Ar gas was 20 sccm-40 sccm, and the plasma power was 0.1 kW-10 kW.

After forming the flexible layer, a barrier layer was formed using HMDS gas and $O_2$ gas in the same way as described above. The rate of introduction of HMDS gas at this time was 3 sccm-20 sccm, the rate of introduction of the $O_2$ gas was 20 sccm-1000 sccm, and the plasma power was 1 kW-10 kW. This silicon oxide film had a composition ratio of Si and O of Si:O=1:1.9-2.1.

The formation process of the flexible layer and the barrier layer was repeated seven times. As a result, as shown in FIG. 2, a layered body in which the flexible layer 4 and the barrier layer 6 are layered in seven steps on the adhesion layer 2 was obtained. The film thickness of one layer of the adhesion layer 2, the flexible layer 4, and the barrier layer 6 was, respectively, 128 nm, 180 nm, and 390 nm.

The concentration of each element in the obtained layered body was measured using the above-described Rutherford backscattering spectroscopy (RBS) and hydrogen forward scattering spectroscopy (HFS). As a result, in the adhesion layer, the oxygen atom concentration was 12% by element, the silicon atom concentration was 17% by element, the hydrogen atom concentration was 44% by element, and the carbon atom concentration was 27% by element; in the flexible layer, the oxygen atom concentration was 7% by element, the silicon atom concentration was 15% by element, the hydrogen atom concentration was 50% by element, the carbon atom concentration was 22% by element, and the nitrogen atom concentration was 6% by element; and in the barrier layer, the oxygen atom concentration was 64% by element, the silicon atom concentration was 32% by element, and the hydrogen atom concentration was 4% by element.

Example 2

In Example 1, besides forming the flexible layer and the barrier layer using HMDSO gas (with the rate of introduction being 3 sccm-30 sccm), a layered body was obtained in the same way as in Example 1. The film thickness of each layer and the concentration of each element were the same as in Example 1.

Example 3

In Example 1, besides forming the flexible layer using HMDSO gas (with the rate of introduction being 3 sccm-30 sccm), a layered body was obtained in the same way as in Example 1. The film thickness of each layer and the concentration of each element were the same as in Example 1.

Example 4

In Example 1, besides forming the barrier layer using HMDSO gas (with the rate of introduction being 3 sccm-20 sccm), a layered body was obtained in the same way as in Example 1. The film thickness of each layer and the concentration of each element were the same as in Example 1.

Example 5

In Example 1, besides forming the adhesive layer using $O_2$ gas (with the rate of introduction being 20 sccm-1000 sccm)

and HMDSO gas (with the rate of introduction being 3 sccm-20 sccm), a layered body was obtained in the same way as in Example 1. The film thickness of each layer was the same as in Example 1. The elemental concentrations were, for the adhesion layer, 25% by element for the oxygen atom concentration, 15% by element for the silicon atom concentration, 40% by element for the hydrogen atom concentration, and 20% by element for the carbon atom concentration.

Example 6

In Example 1, besides forming the adhesion layer using $O_2$ gas (with the rate of introduction being 20 sccm-1000 sccm) and HMDS gas (with the rate of introduction being 3 sccm-20 sccm) and making the plasma power between 0.1 kW-0.5 kW, a layered body was obtained in the same way as in Example 1. The film thickness of each layer was the same as in Example 1. The elemental concentrations were, for the adhesion layer, 30% by element for the oxygen atom concentration, 22% by element for the silicon atom concentration, 30% by element for the hydrogen atom concentration, and 18% by element for the carbon atom concentration.

Example 7

In Example 1, besides forming the adhesion layer using $O_2$ gas (with the rate of introduction being 20 sccm-1000 sccm) and HMDS gas (with the rate of introduction being 3 sccm-20 sccm) and making the plasma power between 0.6 kW-0.9 kW, a layered body was obtained in the same way as in Example 1. The film thickness of each layer was the same as in Example 1. The elemental concentrations were, for the adhesion layer, 35% by element for the oxygen atom concentration, 22% by element for the silicon atom concentration, 28% by element for the hydrogen atom concentration, and 15% by element for the carbon atom concentration.

Comparative Example 1

Besides not forming an adhesion layer, a layered body was obtained in the same way as in Example 1. The film thickness of each layer and the concentration of each element were the same as in Example 1.

Comparative Example 2

Besides conducting $O_2$ plasma treatment on the base material before the deposition of the flexible layer, instead of forming the adhesion layer, a layered body was obtained in the same way as in Example 1. The film thickness of each layer and the concentration of each element were the same as in Example 1.

Comparative Example 3

Besides conducting $Ar+H_2$ plasma treatment on the base material before the deposition of the flexible layer, instead of forming the adhesion layer, a layered body was obtained in the same way as in Example 1. The film thickness of each layer and the concentration of each element were the same as in Example 1.

Comparative Example 4

Besides conducting $N_2$ plasma treatment on the base material before the deposition of the flexible layer, instead of forming the adhesion layer, a layered body was obtained in the same way as in Example 1. The film thickness of each layer and the concentration of each element were the same as in Example 1.

Comparative Example 5

In Example 1, besides forming the adhesive layer using $O_2$ gas (with the rate of introduction being 20 sccm-1000 sccm) and HMDS gas (with the rate of introduction being 3 sccm-20 sccm) and making the plasma power between 1 kW-10 kW, a layered body was obtained in the same way as in Example 1. The film thickness of each layer was the same as in Example 1. The elemental concentrations were, for the adhesion layer, 64% by element for the oxygen atom concentration, 32% by element for the silicon atom concentration, and 4% by element for the hydrogen atom concentration.

Evaluation of Adhesion with the Base Material

Figure 6:
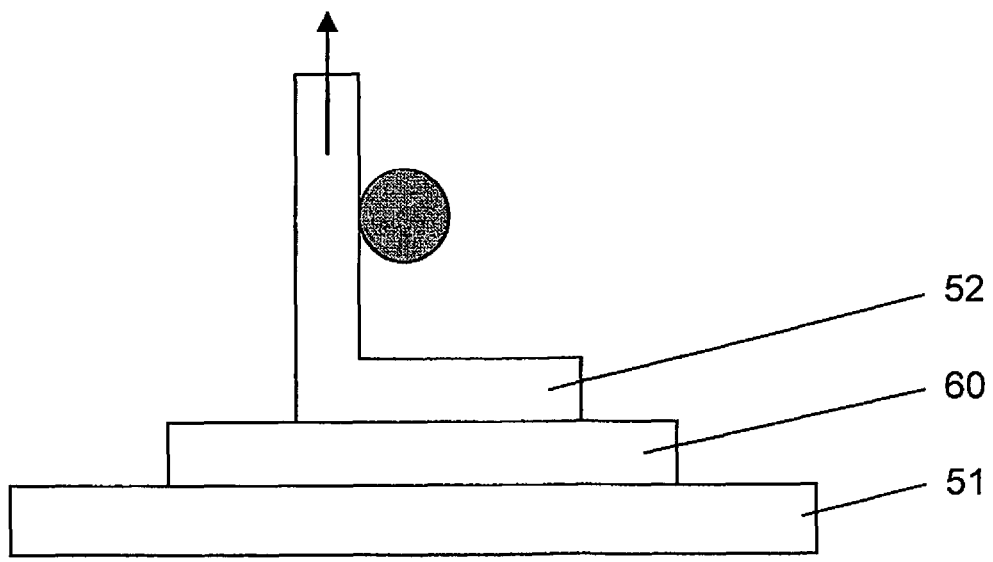
FIG. 6 is a diagram showing an outline of a tape peel test method.

The adhesion between the laminate bodies obtained in Examples 1-7 and Comparative Examples 1-5 and the base material was evaluated in the manner described below. FIG. 6 shows an outline of a tape peel test method. For the tape peel test, first, a Kapton tape 52 with an adhesive force of 2.7 N/10 mm was adhered to a layered body 60 of an adhesion layer and a sealing layer that is formed on the base material 51. This Kapton tape 52 was pulled vertically upward at a 90-degree angle with respect to the base material 51 at a tensile speed of 20 mm/min. The degree of peeling of the layered body 60 in the above case was observed. This test was conducted regarding a layered body 60 on an Ag layer of a base material 51 and a layered body 60 on a plastic film surface by adhering Kapton tape 52 and making an evaluation based on the following criteria. The results are shown in Table 2.

⊚: No peeling at all

○: Almost no peeling

Δ: Around half peeled x: Entirely peeled

Barrier Property Evaluation Method (Ca Test)

An evaluation of the barrier properties was conducted regarding the layered bodies of Examples 1-7. The evaluation of the barrier properties was carried out with a Ca test. A Ca test is a method that calculates the water vapor permeability ($g/m^2/day$) based on changes in the color (=the amount of water that has permeated), utilizing the fact that calcium (a metallic color) reacts with water that has permeated the gas barrier film and becomes calcium hydroxide (which is colorless and transparent). The chemical formula for the color change is shown below.

Ca (metallic color)+$2H_2O \rightarrow Ca(OH)_2$ (transparent)+$H_2$

Figure 7:
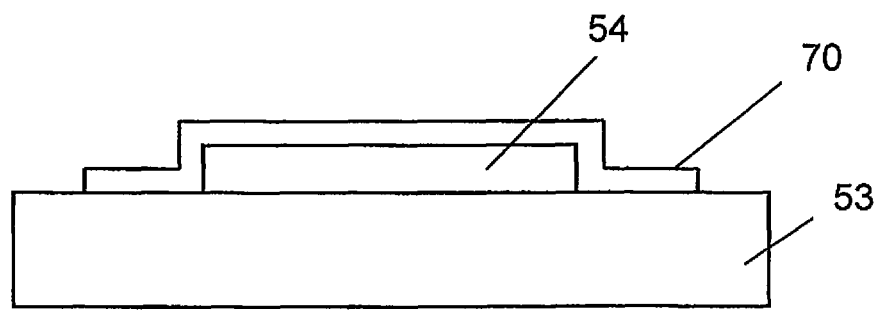
FIG. 7 is a diagram schematically showing a sample for a barrier property evaluation in a calcium test.

Under each of the conditions of Examples 1-4 and Comparative Examples 1-3, the samples for barrier properties evaluation, as shown in FIG. 7, were prepared, and Ca tests were conducted. In FIG. 7, 53 is a glass substrate, 54 is a Ca vapor deposited film, and 70 is a film to be evaluated. The results were $9.0 \times 10^{-5}$ $g/m^2/day$ with the layered body of Example 1; $3.0 \times 10^{-4}$ $g/m^2/day$ with the layered body of Example 2; $2.0 \times 10^{-4}$ $g/m^2/day$ with the layered body of Example 3; and $1.8 \times 10^{-4}$ $g/m^2/day$ with the layered body of Example 4. The barrier properties were also excellent with all of the laminate bodies of Examples 5-7.

TABLE 2

| | Film forming conditions (type of supplied gas) | | | Oxygen (O) concentration (% by element) | | | Result of tape peel test | |
|---|---|---|---|---|---|---|---|---|
| | | | | | | | Adhesion with Ag layer | Adhesion with plastic film |
| | Pre- | | Sealing layer (7/7) | | | | | |
| | treat-ment | Adhesion layer | Flexible layer | Barrier layer | Adhesion layer | Flexible layer | Barrier layer | (inorganic substance) | (organic substance) |
| Example 1 | None | HMDSO | Ar + H$_2$ + HMDS | O$_2$ + HMDS | 12 | 7 | 64 | ◎ | ◎ |
| Example 2 | None | HMDSO | Ar + H$_2$ + HMDSO | O$_2$ + HMDSO | 12 | less than 10 | 60-70 | ◎ | ◎ |
| Example 3 | None | HMDSO | Ar + H$_2$ + HMDSO | O$_2$ + HMDS | 12 | less than 10 | 64 | ◎ | ◎ |
| Example 4 | None | HMDSO | Ar + H$_2$ + HMDS | O$_2$ + HMDSO | 12 | 7 | 60-70 | ◎ | ◎ |
| Example 5 | None | O$_2$ + HMDSO | Ar + H$_2$ + HMDS | O$_2$ + HMDS | 25 | 7 | 64 | ◎ | ◎ |
| Example 6 | None | O$_2$ + HMDS (power low) | Ar + H$_2$ + HMDS | O$_2$ + HMDS | 30 | 7 | 64 | ◎ | ○ |
| Example 7 | None | O$_2$ + HMDS (power medium) | Ar + H$_2$ + HMDS | O$_2$ + HMDS | 35 | 7 | 64 | ○ | ○ |
| Comparative Example 1 | None | None | Ar + H$_2$ + HMDS | O$_2$ + HMDS | — | 7 | 64 | Δ | ◎ |
| Comparative Example 2 | O$_2$ plasma | None | Ar + H$_2$ + HMDS | O$_2$ + HMDS | — | 7 | 64 | — | — |
| Comparative Example 3 | Ar + H$_2$ plasma | None | Ar + H$_2$ + HMDS | O$_2$ + HMDS | — | 7 | 64 | X | ◎ |
| Comparative Example 4 | N$_2$ plasma | None | Ar + H$_2$ + HMDS | O$_2$ + HMDS | — | 7 | 64 | Δ | ◎ |
| Comparative Example 5 | None | O$_2$ + HMDS (power high) | Ar + H$_2$ + HMDS | O$_2$ + HMDS | 64 | 7 | 64 | — | X |

From the above-described results, the finding was that, in a vapor deposited film that is formed using HMDSO gas as the raw material for the adhesion layer, the oxygen concentration could be made to be in a range of 10-35% by element, and adhesion became highest in this case. In order to make a film with good adhesion for both organic substances (for example, PET film) and inorganic substances (for example, Ag), the oxygen concentration must be in a range of 10-35% by element. Additionally, the barrier properties of laminate bodies comprising this adhesion layer were evaluated, and the fact that they display high barrier properties was confirmed.

A barrier film with good adhesion with respect to a base material in which specifically organic substances (an organic-based power generation layer, a light emitting layer, a plastic film (PET and PEN), etc.) and inorganic substances (a transparent conductive film, metal electrodes, an inorganic-based power generation layer, etc.) are mixed and exposed on the surface, such as organic EL elements and solar cells, etc., which are easily deteriorated by moisture and oxygen, can be formed without damaging the base material.

The invention claimed is:
1. A layered body, comprising:
a chemical vapor deposited film including silicon atoms, oxygen atoms, carbon atoms, and hydrogen atoms, with the chemical vapor deposited film being formed by a plasma CVD method such that the concentration of the oxygen atoms is 10-35% by element;
a second chemical vapor deposited film including silicon atoms and oxygen atoms, with the second chemical vapor deposited film being formed by the plasma CVD method such that the oxygen atoms being greater than or equal to 0% by element and less than 10% by element; and
a third chemical vapor deposited film including silicon atoms and oxygen atoms, with the third chemical vapor deposited film being formed by the plasma CVD method such that the oxygen atoms being more than 35% by element and less than or equal to 70% by element,
the second chemical vapor deposited film and the third chemical vapor deposited film being layered on one of surfaces of the chemical vapor deposited film.
2. The layered body recited in claim 1, wherein
a plurality of layers of the second chemical vapor deposited film and a plurality of layers of the third chemical vapor deposited film are alternately layered.
3. The layered body recited in claim 1, wherein
the second chemical vapor deposited film further includes carbon atoms.
4. The layered body recited in claim 1, further comprising a base material including inorganic substances,
the chemical vapor deposited film being layered on the base material such that the other of the surfaces of the chemical vapor deposited film on which the second chemical vapor deposited film and the third chemical vapor deposited film are not layered contacts with the inorganic substances.
5. The layered body recited in claim 4, wherein
the inorganic substance includes Ag, Al, and Mo or a transparent electrode film selected from the group consisting of ZnO, ITO, BZO, AZO, and GZO.
6. An organic EL element comprising:
the laminate body recited in claim 1.
7. The layered body recited in claim 2, wherein
the second chemical vapor deposited film further includes carbon atoms.
8. The layered body recited in claim 2, further comprising a base material including inorganic substances,
the chemical vapor deposited film being layered on the base material such that the other of the surfaces of the chemical vapor deposited film on which the second chemical vapor deposited film and the third chemical vapor deposited film are not layered contacts with the inorganic substances.

9. The layered body recited in claim 3, further comprising a base material including inorganic substances,
the chemical vapor deposited film being layered on the base material such that the other of the surfaces of the chemical vapor deposited film on which the second chemical vapor deposited film and the third chemical vapor deposited film are not layered contacts with the inorganic substances.

10. The layered body recited in claim 7, further comprising a base material including inorganic substances,
the chemical vapor deposited film being layered on the base material such that the other of the surfaces of the chemical vapor deposited film on which the second chemical vapor deposited film and the third chemical vapor deposited film are not layered contacts with the inorganic substances.

11. The layered body recited in claim 8, wherein
the inorganic substance includes Ag, Al, and Mo or a transparent electrode film selected from the group consisting of ZnO, ITO, BZO, AZO, and GZO.

12. The layered body recited in claim 9, wherein
the inorganic substance includes Ag, Al, and Mo or a transparent electrode film selected from the group consisting of ZnO, ITO, BZO, AZO, and GZO.

13. The layered body recited in claim 10, wherein
the inorganic substance includes Ag, Al, and Mo or a transparent electrode film selected from the group consisting of ZnO, ITO, BZO, AZO, and GZO.

14. A thin film solar cell comprising:
the laminate body recited in claim 1.

* * * * *